(12) United States Patent
Lee

(10) Patent No.: US 6,486,022 B2
(45) Date of Patent: Nov. 26, 2002

(54) METHOD OF FABRICATING CAPACITORS

(75) Inventor: Kee Jeung Lee, Seoul (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 10/026,771

(22) Filed: Dec. 27, 2001

(65) Prior Publication Data

US 2002/0160565 A1 Oct. 31, 2002

(30) Foreign Application Priority Data

Apr. 30, 2001 (KR) .......................................... 2001-23406

(51) Int. Cl.$^7$ ........................ H01L 21/8242; H01G 7/06
(52) U.S. Cl. ........................ 438/240; 438/238
(58) Field of Search ........................ 438/3, 240, 238, 438/381, 250–256, 393–399

(56) References Cited

U.S. PATENT DOCUMENTS 6,326,259 B1 * 12/2001 Kim et al. .................. 438/240
6,337,291 B1 *  1/2002 Park et al. .................. 438/253

* cited by examiner

*Primary Examiner*—Jey Tsai
(74) *Attorney, Agent, or Firm*—Pillsbury Winthrop LLP

(57) ABSTRACT

Disclosed is a capacitor for a semiconductor device and a method of fabricating such capacitors including the steps of providing a semiconductor substrate, forming a lower electrode on the semiconductor substrate, forming a $Ta_{1-x}Al_xO_yN_z$ ($0.01 \leq x \leq 0.5$, $2 \leq y \leq 2.5$, $0.01 \leq z \leq 0.1$) dielectric layer on the lower electrode, and forming an upper electrode on the $Ta_{1-x}Al_xO_yN_z$ dielectric layer so as to provide excellent electric characteristics as well as sufficient electric capacitance required for the proper operation of highly integrated semiconductor devices.

33 Claims, 5 Drawing Sheets

METHOD OF FABRICATING CAPACITORS

BACKGROUND OF THE INVENTION

1. Field of the Invention

The present invention relates to a semiconductor memory and, more particularly, to a capacitor in a semiconductor device and a method of fabricating a capacitor that provides both excellent electric characteristics and sufficient electric capacitance necessary for operation of the semiconductor device.

2. Background of the Related Art

As the degree of integration of memory products accelerates with the development of ever finer semiconductor imaging technology, unit cell areas have been greatly decreased and operating voltages have been decreased.

Despite the decreasing cell area and the reduced voltage, the minimum charge capacitance required for memory device operation has remained on the order of at least 25 fF/cell to prevent soft error generation and refresh time reduction.

In conventional DRAM capacitor utilizing a nitride/oxide ("NO") layer structure as a dielectric, a lower electrode is constructed with a three-dimensional structure and/or with increased height, thereby increasing the effective surface area to provide sufficient charge capacitance.

However, the extent to which a three-dimensional lower electrode can be employed to increase charge capacitance is limited as a result of process difficulties.

Moreover, increasing the height of the lower electrode results in an increasing step difference between cell and peripheral circuit areas, eventually degrading the integration process after the wire formation due to an inability to achieve a sufficient depth of focus during subsequent exposure processes.

Therefore, a capacitor having the NO structure of the conventional art fails to provide the charge capacitance required for a next generation DRAM device of over 256M memory cells.

Lately, the development of $Ta_2O_5$ capacitors, which use $Ta_2O_5$ films having dielectric constants k typically ranging from 25 to 27, instead of NO films having dielectric constants ranging 4 to 5, are made so as to overcome some of the shortcomings of NO capacitors.

In view of these aspects, a capacitor in a semiconductor device and a fabrication method thereof according to a conventional prior art method are explained with reference to FIGS. 1–3.

FIG. 1 shows a cross-sectional view of a capacitor using a $Ta_2O_5$ film as a dielectric layer regarding a capacitor in a semiconductor device and fabrication method thereof according to a related art.

FIG. 2 shows oxygen vacancies and carbon impurities existing in a $Ta_2O_5$ dielectric film are removed by oxygen radicals during thermal treatment after formation of the $Ta_2O_5$ dielectric film during the fabrication of a capacitor according to conventional prior art method.

FIG. 3 is a SEM photo showing a cross-sectional view of a capacitor in which an $N_2O$ thermal treatment (oxidation treatment) process was performed after the deposition of a $Ta_2O_5$ film to form a capacitor dielectric in a semiconductor device according to a conventional prior art method.

Referring to FIG. 1, an insulating interlayer 3 is formed on a semiconductor substrate 1. A portion of the semiconductor substrate 1 is exposed by patterning and etching the insulating interlayer 3. A doped polysilicon layer is then deposited on the insulating interlayer 3 and the exposed semiconductor substrate 1. A lower electrode 5 is then formed by patterning and etching the doped polysilicon layer.

After a $Ta_2O_5$ film 7 has been formed on an upper surface of the insulating interlayer 3 and on the exposed surfaces of the lower electrode 5, an upper electrode 9 is formed by stacking TiN and doped polysilicon on the $Ta_2O_5$ film 7 to complete the fabrication of the capacitor.

Because the $Ta_2O_5$ film 7 of the capacitor according to the conventional art methods, as represented in FIG. 2, has an unstable stoichiometric ratio, substitution type Ta atoms exist in the film as a result of the difference in the composition ratio between Ta and O.

Namely, it is inevitable that substitution type Ta atoms having an oxygen vacancy state exist locally in the film due to the unstable chemical composition ratio of the material itself.

Further, although the number of the oxygen vacancies in the $Ta_2O_5$ film may vary locally in accordance with the contents of the components and their bonding degree, they will exist to some degree.

Therefore, in order to prevent or reduce the leakage current of the resulting capacitor an additional oxidation process is required in which the substitution type Ta atoms remaining in a dielectric film are oxidized by stabilize the stoichiometric ratio of the $Ta_2O_5$ film. Moreover, the $Ta_2O_5$ film has a high oxidation reactivity with polysilicon (oxide based electrode) or TiN (metal based electrodes) used for upper and lower electrodes, thereby forming a low dielectric oxide layer and greatly reducing the homogeneity at an interface as a result of the migration of oxygen in the film to the interface.

When the film is formed, carbon atoms, carbon compounds such as $CH_4$, $C_2H_4$ and the like, and $H_2O$ are produced as impurities by the reaction between organic portions of $Ta(OC_2H_5)_5$ and then $O_2$ or $N_2O$ gas used to form the $Ta_2O_5$ film.

Consequently, oxygen vacancies as well as carbon atoms, ions, and radicals existing in the $Ta_2O_5$ film as impurities increase the leakage current of the capacitor and degrade the dielectric characteristics of the resulting device.

In order to address these impurities, a subsequent thermal treatment (oxidation) in an electrical furnace or RTP in $N_2O$ or $O_2$ ambient has been used to overcome these problems.

However, in the subsequent treatments of the prior art methods, as shown in FIG. 3, an oxygen radical ($O^+$) component as an oxidizer diffuses into an interface between the doped polysilicon layer, used as the electric charge storage electrode, and the $Ta_2O_5$ dielectric layer forms an oxide ($SiO_2$) layer having a low dielectric constant thus increasing the equivalent oxide layer thickness ($T_{ox}$) of the resulting capacitor.

As shown in FIG. 3, it is practically unable to attain a value under $T_{ox}=30$ Å due to the existence of the oxide layer about 25 to 35 Å thick at the interface even though $Ta_2O_5$ has a relatively high dielectric constant (k=25).

Therefore, a capacitor using the prior art $Ta_2O_5$ dielectric layer fails to provide a charge capacitance more than about 1.5 times larger than that of an NO capacitor of equal area.

SUMMARY OF THE INVENTION

Accordingly, the present invention is directed to a capacitor for a semiconductor device and a method of fabricating such capacitors that substantially obviates one or more of the problems arising from the limitations and disadvantages of the related art.

An object of the present invention is to provide a capacitor for a semiconductor device and a method of fabricating such capacitors that provide excellent electrical characteristics as well as provide sufficient charge capacitance for high density semiconductor devices.

Another object of the present invention is to provide a capacitor for a semiconductor device and a method of fabricating such capacitors provides sufficient electric charge capacitance for use in a highly-integrated device using charge storage electrode having a simple stacked or concave structure, thereby reducing product cost by decreasing the number of unit processes and unit process times necessary to form the capacitor.

A further object of the present invention is to provide a capacitor for a semi-conductor device and a method of fabricating such capacitors that provide a capacitor having a dielectric film having a dielectric constant that is higher and a stoichiometric ratio that is more stable than conventional $Ta_2O_5$, using LPCVD.

Another further object of the present invention is to provide a capacitor for a semiconductor device and a method of fabricating such capacitors using low temperature plasma oxidation treatment prevents a low dielectric oxide layer from being formed at the interface between the lower electrode and the dielectric layer and removes impurities existing in the dielectric layer.

Additional features and advantages of the invention will be set forth in the description that follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages, and in accordance with the purpose of the present invention as embodied and broadly described, a method of fabricating a capacitor in a semiconductor device according to the present invention includes the steps of providing a semiconductor substrate, forming a lower electrode on the semiconductor substrate, forming a $Ta_{1-x}Al_xO_yN_z$ ($0.01 \leq x \leq 0.5$, $2 \leq y \leq 2.5$, $0.01 \leq z \leq 0.1$) dielectric layer on the lower electrode, and forming an upper electrode on the $Ta_{1-x}Al_xO_yN_z$ dielectric layer.

In another aspect, a method of fabricating a capacitor in a semiconductor device according to the present invention includes the steps of providing a semiconductor substrate, forming a lower electrode on the semiconductor substrate, forming a $Ta_{1-x}Al_xO_yN_z$ dielectric layer on the lower electrode, carrying out oxidation treatment on $Ta_{1-x}Al_xO_yN_z$ dielectric layer using a low temperature plasma, inducing crystallization by annealing the oxidation-treated $Ta_{1-x}Al_xO_yN_z$ dielectric layer, and forming an upper electrode on the $Ta_{1-x}Al_xO_yN_z$ dielectric layer.

In a further aspect, a capacitor in a semiconductor device according to the present invention includes a semiconductor substrate, a lower electrode on the semiconductor substrate, a $Ta_{1-x}Al_xO_yN_z$ dielectric layer on the lower electrode, and an upper electrode on the $Ta_{1-x}Al_xO_yN_z$ dielectric layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE PREFERRED EMBODIMENTS

Figure 1:
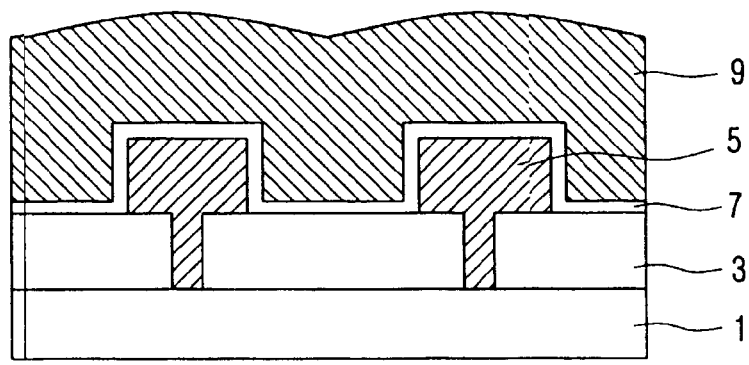
FIG. 1 shows a cross-sectional view of semiconductor device having a capacitor using a conventional $Ta_2O_5$ film as a dielectric layer.
Figure 2:
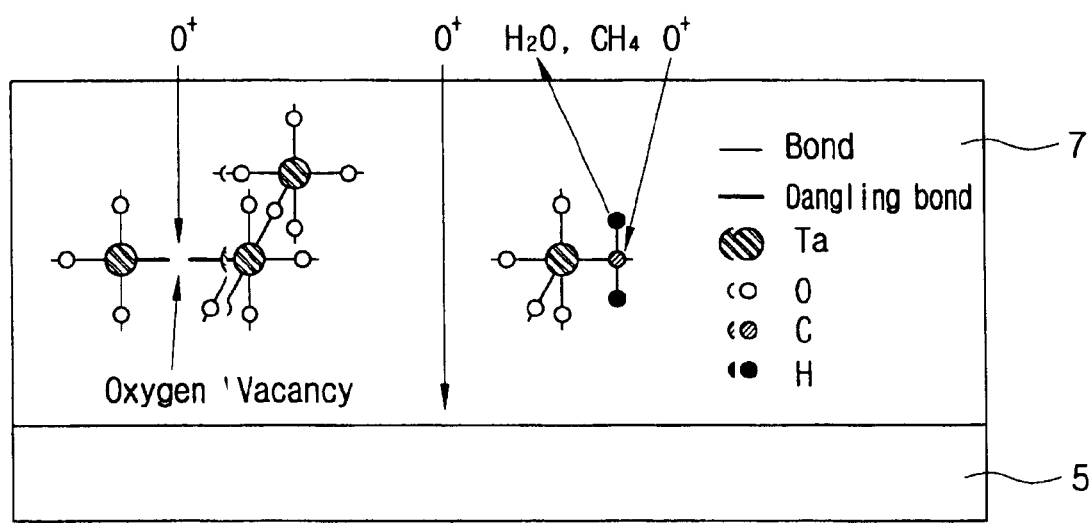
FIG. 2 illustrates the method by which oxygen vacancies and carbon impurities existing in a $Ta_2O_5$ dielectric film are removed by oxygen radicals during thermal treatment after the formation of the $Ta_2O_5$ dielectric layer according to a prior art fabrication method.
Figure 3:
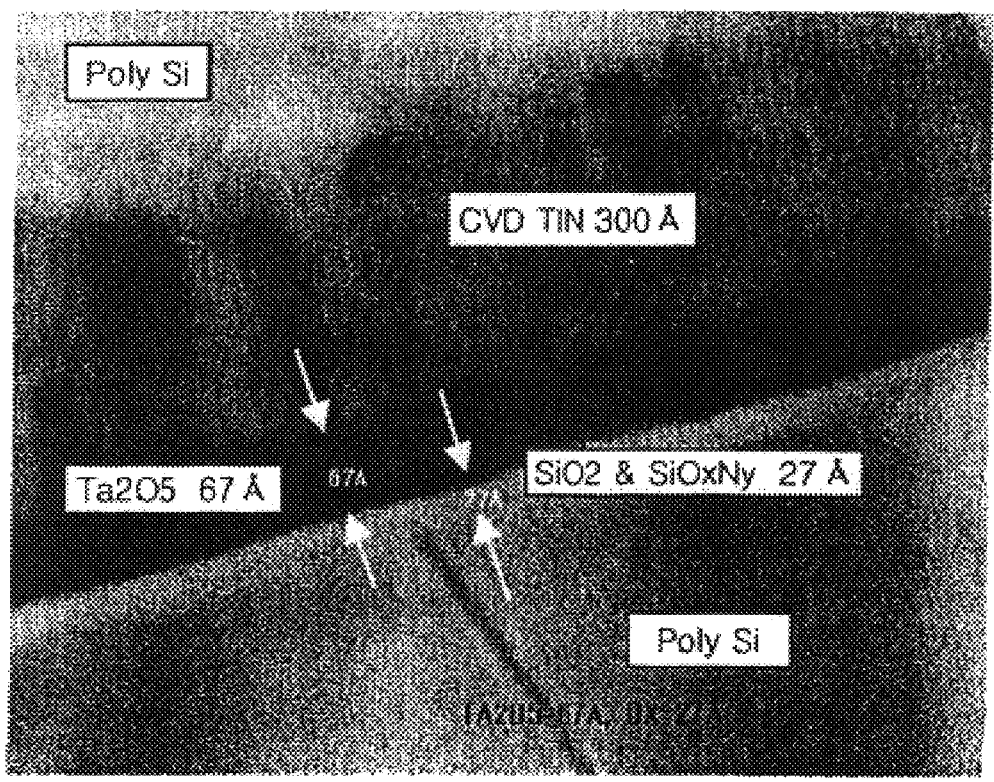
FIG. 3 is a SEM photo showing a cross-sectional view of a capacitor in which an $N_2O$ thermal treatment (oxidation treatment) process is carried out after the deposition of a $Ta_2O_5$ film for forming a capacitor in a semiconductor device.

Reference will now be made in detail to the preferred embodiments of the present invention, examples of which are illustrated in the accompanying drawings. Where possible, the same reference numerals will be used to identify similar or corresponding elements throughout the specification.

Figure 4:
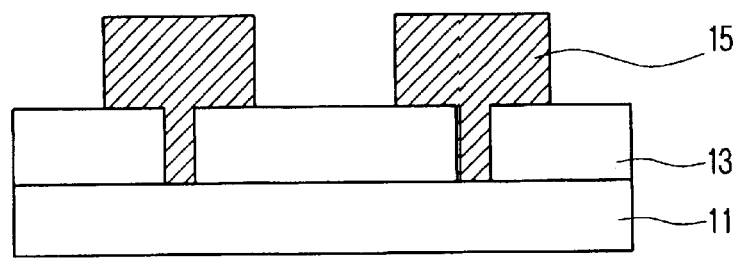
FIGS. 4–7 show cross-sectional views of a method for fabricating a capacitor for a semiconductor device according to an embodiment of the present invention.

Referring to FIG. 4, an insulating interlayer 13 is formed on a semiconductor substrate 11 on which various structures (not shown in the drawing) are formed during the fabrication of a semiconductor device. A contact (not shown in the drawing) is formed in the insulating interlayer 13 to for establishing contact to the substrate 11.

A lower electrode 15 is then formed by depositing a conductive material layer, for example, doped polysilicon, on an upper surface of the insulating interlayer and into the contact opening and then patterning and etching the conductive material layer.

In this case, the lower electrode 15 may be formed of one of a variety of silicon-based materials, such as doped amorphous silicon or polysilicon or metal-based materials such as TiN, TaN, W, WN, WSi, Ru, $RuO_2$, Ir, $IrO_2$, or Pt.

In other embodiments of the lower electrode 15, various three-dimensional structures such as a double or triple structures based on cylindrical structure or a simple stacked structures may be utilized to increase the effective surface areas of the lower electrode.

Figure 8:
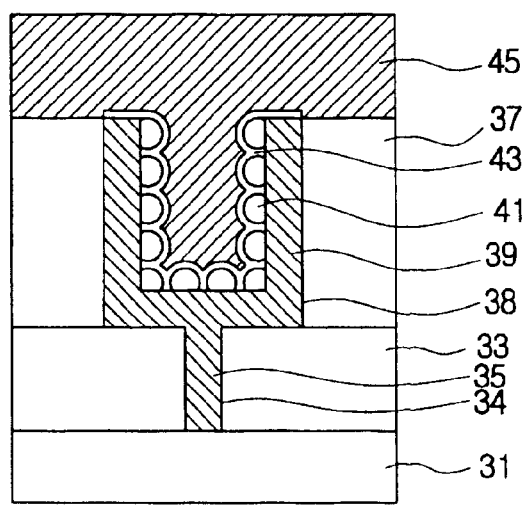
FIG. 8 shows a cross-sectional view of a capacitor in a semiconductor device according to embodiment of the present invention.
Figure 9:
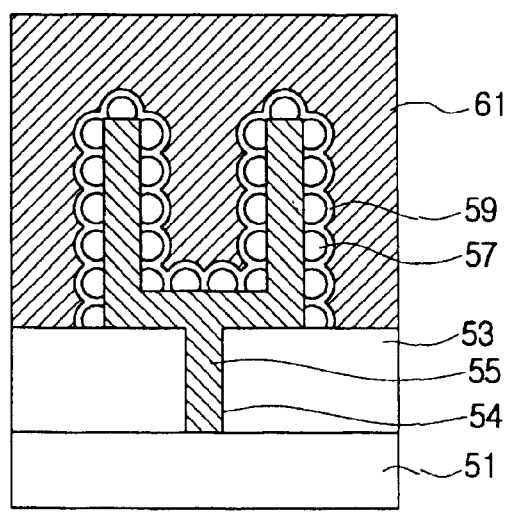
FIG. 9 shows a cross-sectional view of a capacitor in a semiconductor device according to a third embodiment of the present invention.

Moreover, in other embodiments of the lower electrode 15, the lower electrode may be formed as a storage node having a concave structure, such as illustrated in FIG. 8, or a cylindrical structure, such as illustrated in FIG. 9, and then forming a polysilicon layer having a HSG (Hemi-Spherical Grain) structure on the exposed surfaces of the storage node.

Figure 5:
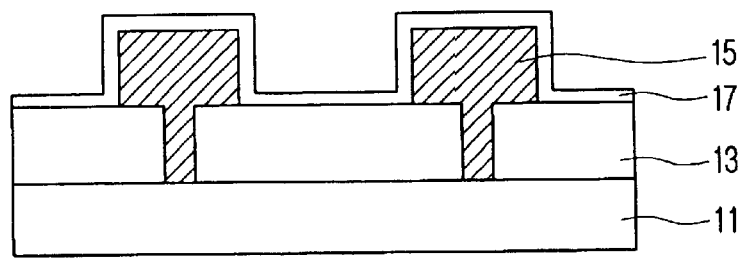

Referring to FIG. 5, a thin nitride layer 17 is formed on a surface of the lower electrode 15 by carrying out nitridation on the surface of the lower electrode 15.

In this case, the nitride layer 17 prevents a natural oxide layer ($SiO_2$) having a low dielectric constant from forming at the interface between a dielectric layer and the lower electrode 15 during formation of the dielectric layer or during a subsequent thermal processing.

Moreover, the nitride layer 17 is formed by nitridation in a manner that in-situ plasma is discharged in a low pressure chemical vapor deposition (LPCVD) chamber in an ambient of $NH_3$ or $N_2/H_2$ gas while maintaining the temperature of the substrate at 300 to 500° C.

Instead of using plasma, the nitride layer 17 may be formed by annealing at a temperature of 650 to 950° C. in an ambient of $NH_3$ using a rapid thermal process (RTP) or at a temperature of 500 to 1000° C. at an ambient of $NH_3$ using an electric furnace.

On the other hand, in order to prevent a natural oxide layer ($SiO_2$) having a low dielectric constant from being formed at the interface between the dielectric layer and the lower electrode 15 when the dielectric layer of a capacitor is formed or during subsequent thermal processing, the natural oxide layer may be removed from the surface of the lower electrode 15 using HF vapor or an HF solution instead of forming the nitride layer 17.

Moreover, prior to forming the nitride layer 17, the interface may be treated with chemicals such as a $NH_4ON$ solution, a $H_2SO_4$ solution or the like in order to improve uniformity. This surface treatment may be performed either after or before the HF surface treatment on the lower electrode 15 using HF.

As mentioned in the foregoing description, in order to increase oxidation resistance of the interface between the electrode and the dielectric layer of a capacitor, the surface of the lower electrode 15 is nitridated at a temperature of 300 to 950° C. in an ambient of $NH_3$ or $N_2/H_2$ gas using plasma or RTP or thermally treated in an ambient of $N_2O$ or $O_2$ gas. Thus, structural defects and non-homogeneity due to dangling bonds are reduced to improve the leakage current characteristics of the resulting device.

As an alternative to forming nitride layer 17, the formation of a low dielectric oxide layer at an interface between a dielectric layer and the lower electrode 15 may be substantially suppressed or prevented by the sequential in-situ deposition of the lower electrode 15 and the dielectric layer in the same LPCVD system, preferably a system having lower electrode and dielectric layer deposition chambers positioned to allow a water to be moved between them without a vacuum break.

Figure 6:
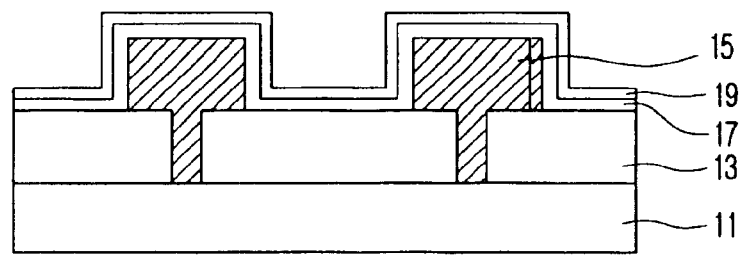

Referring to FIG. 6, a $Ta_{1-x}Al_xO_yN_z$ ($0.01 \leq x \leq 0.5$, $2 \leq y \leq 2.5$, $0.01 \leq z \leq 0.1$) dielectric layer 19 is deposited on an upper surface of the entire structure, including the nitride layer 17.

In this case, $Ta(OC_2H_5)_5$ (tantalum ethylate) and $Al(OC_2H_5)_3$ (aluminum ethylate) are preferably used as precursors to the $Ta_{1-x}Al_xO_yN_z$ dielectric layer 19.

A process of forming the $Ta_{1-x}Al_xO_yN_z$ dielectric layer 19 is briefly explained as follows.

First, an LPCVD chamber is supplied with $NH_3$ gas at a temperature of 300 to 600° C. at a flow of 10 to 1000 sccm. In this case, the flow of the $NH_3$ gas is preferably within a range between 30 and 600 sccm, or, more preferably, between 50 to 300 sccm so as to provide a constant flow.

And, an evaporator or an evaporation tube maintaining a fixed temperature of 150 to 300° C. is supplied with measured amounts of an organometallic compound solution containing $Ta(OC_2H_5)_5$ (tantalum ethylate) and $Al(OC_2H_5)_3$ (aluminum ethylate) through a flow controller. Chemical vapor of Ta and Al components for CVD is then obtained by evaporating the solution.

Subsequently, the chemical vapor of the Ta and Al components for CVD is injected into the LPCVD chamber through a supply pipe having a temperature of at least 150° C., thereby initiating deposition of the desired film. The conditions for the CVD are maintained to provide a total pressure of the chemical vapor and $NH_3$ gas in the chamber between 0.1 and 100 Torr, preferably 0.12 to 50 Torr, or, more preferably, at 0.13 to 10 Torr.

Thus, the $Ta_{1-x}Al_xO_yN_z$ dielectric layer 19 attained by the above procedure is deposited to a thickness of 50 to 150 Å thick, and preferably 55 to 100 Å thick.

Then, oxygen vacancies, as well as carbon impurities, remaining in the dielectric film are removed simultaneously by carrying out an oxidation under low temperature plasma in an ambient of $N_2O$ or $O_2$ gas at a temperature of 300 to 600° C.

Next, the $Ta_{1-x}Al_xO_yN_z$ dielectric layer 19 that has been oxidized in the low temperature plasma is annealed in an electric furnace or RTP at a temperature of about 700 to 900° C. in an ambient of $N_2$ or $NH_3$, thereby increasing a dielectric constant of the dielectric layer by inducing crystallization.

As an alternative, the $Ta_{1-x}Al_xO_yN_z$ dielectric layer 19, after being oxidized in the low temperature plasma, may be in-situ crystallized in an adjacent RTP chamber that is clustered with the plasma chamber to allow the wafer to be moved without a vacuum-break.

On the other hand, without carrying out the plasma oxidation treatment process, the $Ta_{1-x}Al_xO_yN_z$ dielectric layer 19, is annealed at a temperature of about 700 to 900° C. in an ambient of $N_2O$ or $O_2$ at a normal or reduced pressure in an electric furnace or in RTP equipment, thereby inducing crystallization and removing the carbon impurities and oxygen vacancies in the dielectric layer 19 simultaneously.

Figure 7:
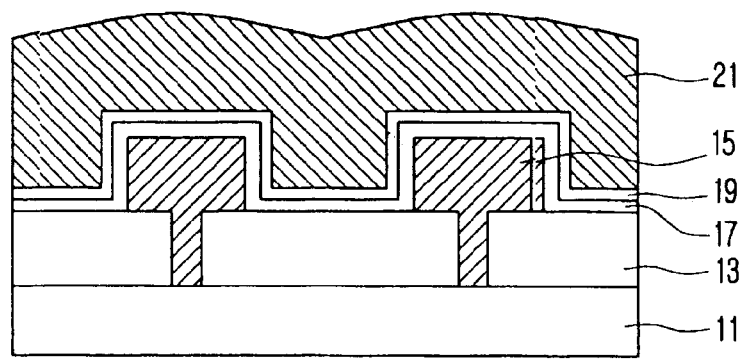

The upper electrode 21, as shown in FIG. 7, is then formed on the $Ta_{1-x}Al_xO_yN_z$ dielectric layer 19 to complete the capacitor fabrication.

In this case, the upper electrode 21 completes the construction a SIS (silicon-insulator-silicon) type capacitor using doped polysilicon or a MIS (metal-insulator-silicon) type capacitor using a metal based materials such as TiN, TaN, W, WN, WSi, Ru, $RuO_2$, Ir, $IrO_2$, or Pt.

As another embodiment of the upper electrode 21, a metal material layer (not shown in the drawing), for example TiN, is deposited 100 to 600 Å thick on the $Ta_{1-x}Al_xO_yN_z$ dielectric layer 19 and then a doped polysilicon layer (not shown in the drawing), that will act as a buffer layer to prevent electric characteristics of a capacitor from being degraded during succeeding thermal processes, is stacked on the metal material layer. Thus, the metal material layer and doped polysilicon layer combined form a stacked upper electrode.

In this case, the metal material layer (not shown in the drawing) is formed from one of metal based materials such as TiN, TaN, W, WN, WSi, Ru, $RuO_2$, Ir, $IrO_2$, or Pt.

As a further embodiment of the present invention, a MIM (metal-insulator-metal) type capacitor device maybe fabricated by forming both the lower and upper electrodes using one of metal based materials such as TiN, TaN, W, WN, WSi, Ru, $RuO_2$, Ir, $IrO_2$, or Pt rather than doped or undoped polysilicon.

FIG. 8 shows a cross-sectional view of a capacitor in a semiconductor device according to another embodiment of the present invention.

Referring to FIG. 8, a lower electrode is formed to be concave. A first insulating interlayer 33 having a first contact hole 34 is formed on a semiconductor substrate 31. And, a second insulating interlayer 37 having a second contact hole 38 therein is formed on the first insulating interlayer 33 including the first contact hole 34.

In the second contact hole 38 including the first contact hole 34, a doped polysilicon layer pattern 35 having a concave shape is formed to fill up the first contact hole 34.

A HSG layer 41 is then formed on an exposed surface of the doped polysilicon layer pattern 35. In this case, the HSG layer 41 and doped polysilicon pattern 35 form the lower electrode.

Moreover, a dielectric layer 43 is formed on the HSG layer 41 and second insulating interlayer 37 while an upper electrode 45 is formed on the dielectric layer 43, thereby constructing a capacitor in a semiconductor device.

In this case, the dielectric layer 43 is formed using the $Ta_{1-x}Al_xO_yN_z$ dielectric layer in the foregoing embodiment according to the present invention.

In this case, the upper electrode 45 constructs an SIS (silicon-insulator-silicon) type capacitor using doped polysilicon or an MIS (metal-insulator-silicon) type capacitor using one of metal based materials such as TiN, TaN, W, WN, WSi, Ru, $RuO_2$, Ir, $IrO_2$, or Pt. Besides, the upper electrode 45 may be constructed by stacking a polysilicon layer on the metal based material layer.

FIG. 9 shows a cross-sectional view of a capacitor in a semiconductor device according to a further embodiment of the present invention.

Referring to FIG. 9, a further embodiment according to the present invention includes a lower electrode having a cylindrical shape. An insulating interlayer 53 having a contact hole 54 is formed on a semiconductor layer 51. A cylindrical type doped polysilicon layer pattern 55 is then formed on the contact hole 54 and insulating interlayer 53.

A HSG layer 57 is formed on the exposed surface of the doped polysilicon layer pattern 55. In this case, the HSG layer 57 and the doped polysilicon pattern 55 construct the lower electrode.

Moreover, a dielectric layer 59 is formed on the HSG layer 57 and insulating interlayer 53 while an upper electrode 61 is formed on the dielectric layer 59, thereby constructing a capacitor in a semiconductor device. In this case, the dielectric layer 59 is formed using the $Ta_{1-x}Al_xO_yN_z$ dielectric layer in the foregoing embodiment according to the present invention.

In this case, the upper electrode 61 constructs an SIS (silicon-insulator-silicon) type capacitor using doped polysilicon or an MIS (metal-insulator-silicon) type capacitor using one of metal based materials such as TiN, TaN, W, WN, WSi, Ru, $RuO_2$, Ir, $IrO_2$, or Pt. Alternatively, the upper electrode 61 may be constructed by stacking a polysilicon layer on the metal based material layer.

Accordingly, a capacitor in semiconductor device and fabrication method thereof according to the present invention provides the following advantages.

A capacitor in semiconductor device and fabrication method thereof according to the present invention using a Ta—Al—ON dielectric layer effectively prevents leakage current due to oxygen vacancies and carbon impurities generated from a dielectric layer having an unstable stoichiometric ratio as in the prior art dielectrics.

And, in the present invention, using a low temperature plasma oxidation treatment prevents a low dielectric oxide layer from being formed at an interface between the lower electrode and the dielectric layer, thereby preventing leakage current due to an irregular oxide layer as well as to control the thickness ($T_{ox}$) of an equivalent oxide layer of a capacitor to a thickness below 25 Å.

Moreover, the present invention provides a Ta—Al—ON dielectric layer having a dielectric ratio suitable for memory cells of semiconductor devices having a critical dimension of micro-circuit of less than 0.18 µm, thereby requiring no complicated processing of the lower electrode into a complex three-dimensional structure in order to increase the lower electrode area.

Accordingly, the present invention provides a sufficient electric charge capacitance of over 25 fF/cell despite using a simple stack or concave lower electrode, thereby reducing product cost by decreasing the number of unit processes and the overall unit process time.

Leakage current of a Ta—Al—ON film of the present invention is less than that of a $Ta_2O_5$ dielectric layers of the prior art. Further, the Ta—Al—ON film of the present invention is more stable than the $Ta_2O_5$ dielectric layer of the prior art. And, breakdown voltage of the Ta—Al—ON film of the present invention is higher than that of the $Ta_2O_5$ dielectric layer of the prior art, thereby providing excellent electrical breakdown field characteristics. Thus, the present invention provides a sufficient charge capacitance of over 25 fF/cell for a memory cell of a next generation product to which a micro critical dimension of less than 0.13 µm is applied.

The foregoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

I claim:

1. A method of fabricating a capacitor for a semiconductor device comprising the steps of:
    providing a semiconductor substrate;
    forming a lower electrode on the semiconductor substrate;
    forming a $Ta_{1-x}Al_xO_yN_z$ ($0.01 \leq x \leq 0.5$, $2 \leq y \leq 2.5$, $0.01 \leq z \leq 0.1$) dielectric layer on the lower electrode; and
    forming an upper electrode on the $Ta_{1-x}Al_xO_yN_z$ dielectric layer.

2. A method of fabricating a capacitor for a semiconductor device according to claim 1, wherein the lower electrode comprises a silicon material.

3. A method of fabricating a capacitor for a semiconductor device according to claim 1, wherein the lower electrode comprises a stacked, cylindrical, or concave structure.

4. A method of fabricating a capacitor for a semiconductor device according to claim 1, further comprising a step of forming a HSG (Hemi-Spherical Grain) layer on a surface of the lower electrode.

5. A method of fabricating a capacitor for a semiconductor device according to claim 1, wherein the lower electrode comprises at least one material selected from a group consisting of TiN, TaN, W, WN, WSi, Ru, $RuO_2$, Ir, $IrO_2$, and Pt.

6. A method of fabricating a capacitor for a semiconductor device according to claim 1, further comprising a step of nitridating or oxidizing the lower electrode before forming the $Ta_{1-x}Al_xO_yN_z$ dielectric layer.

7. A method of fabricating a capacitor for a semiconductor device according to claim 6, wherein the step of nitridating the lower electrode further comprises forming a plasma in a low pressure chemical vapor deposition (LPCVD) chamber under an ambient of $NH_3$ or $N_2/H_2$ gas while maintaining the semiconductor substrate at a temperature of 300 to 500° C.

8. A method of fabricating a capacitor for a semiconductor device according to claim 6, wherein the step of nitridating the lower electrode further comprises subjecting the lower electrode to a rapid thermal anneal (RTA) at a temperature of 650 to 950° C. in an ambient of $NH_3$.

9. A method of fabricating a capacitor for a semiconductor device according to claim 6, wherein the step of nitridating on the lower electrode is carried out at a temperature of 500 to 1000° C. under an $NH_3$ ambient.

10. A method of fabricating a capacitor for a semiconductor device according to claim 1, further comprising a step of cleansing the semiconductor substrate using a HF compound, the HF compound being applied as a HF vapor or a HF solution, the step of cleansing the semiconductor substrate being completed before the step of forming the $Ta_{1-x}Al_xO_yN_z$ dielectric layer.

11. A method of fabricating a capacitor for a semiconductor device according to claim 1, where in the step of forming the $Ta_{1-x}Al_xO_yN_z$ dielectric layer further comprises
supplying an LPCVD chamber with $NH_3$ gas at a temperature of 300 to 600° C. at a flow of 10 to 1000 sccm, and maintaining a pressure in the LPCVD chamber of not more than 100 Torr;
supplying an evaporator or a n evaporation tube, the evaporator or evaporation tube being maintained at a substantially constant temperature between 150 and 300° C., at a predetermined rate with an organometallic compound solution, the organometallic compound solution comprising $Ta(OC_2H_5)_5$ (tantalum ethylate) and $Al(OC_2H_5)_3$ (aluminum ethylate);
evaporating the organometallic compound solution to produce a chemical vapor comprising a Ta component and an Al component;
transferring the chemical vapor to the LPCVD chamber through a supply pipe, the supply pipe being maintained at a temperature of at least 150° C.; and
depositing a $Ta_{1-x}Al_xO_yN_z$ dielectric layer on the semiconductor substrate.

12. A method of fabricating a capacitor for a semiconductor device according to claim 1, further comprising a step of oxidizing the $Ta_{1-x}Al_xO_yN_z$ dielectric layer under a low temperature plasma, in an ambient of $N_2O$ or $O_2$ gas, at a temperature of 300 to 600° C.

13. A method of fabricating a capacitor for a semiconductor device according to claim 12, further comprising a step of annealing the $Ta_{1-x}Al_xO_yN_z$ dielectric layer wherein the semiconductor substrate is placed in an electric furnace or in a RTP device at a temperature of about 700 to 900° C. under an ambient of $N_2$ or $NH_3$ for a time sufficient to induce substantial crystallization of the $Ta_{1-x}Al_xO_yN_z$ dielectric layer, the step of annealing being performed after the step of oxidizing the $Ta_{1-x}Al_xO_yN_z$ dielectric layer has been completed.

14. A method of fabricating a capacitor for a semiconductor device according to claim 13, wherein the step of annealing the $Ta_{1-x}Al_xO_yN_z$ dielectric layer in a RTP device further comprises an in-situ process wherein the semiconductor substrate is transferred from a chamber used for oxidizing the $Ta_{1-x}Al_xO_yN_z$ dielectric layer to an adjacent RTP chamber for the annealing step without a vacuum-break.

15. A method of fabricating a capacitor for a semiconductor device according to claim 1, further comprising a step of annealing the $Ta_{1-x}Al_xO_yN_z$ dielectric layer at a temperature of about 700 to 900° C. in an ambient of $N_2O$ or $O_2$, at a pressure no greater than atmospheric pressure.

16. A method of fabricating a capacitor for a semiconductor device according to claim 1, wherein the step of forming the upper electrode further comprises depositing at least one conductive material selected from a group consisting of TiN, TaN, W, WN, WSi, Ru, $RuO_2$, Ir, $IrO_2$, and Pt.

17. A method of fabricating a capacitor for a semiconductor device according to claim 16, wherein the step of forming the upper electrode further comprises depositing a layer of at least one conductive material to a thickness of 100 to 600 Å thick on the $Ta_{1-x}Al_xO_yN_z$ dielectric layer and depositing a layer of doped polysilicon on the layer of conductive material.

18. A method of fabricating a capacitor for a semiconductor device according to claim 1, wherein the step of forming the lower electrode and the step of forming the upper electrode further comprise depositing at least one conductive material selected from a group consisting of doped polysilicon, TiN, TaN, W, WN, WSi, Ru, $RuO_2$, Ir, $IrO_2$, and Pt.

19. A method of fabricating a capacitor in a semiconductor device comprising the steps of:
providing a semiconductor substrate;
forming a lower electrode on the semiconductor substrate;
forming a $Ta_{1-x}Al_xO_yN_z$ ($0.01 \leq x \leq 0.5$, $2 \leq y \leq 2.5$, $0.01 \leq z \leq 0.1$) dielectric layer on the lower electrode;
oxidizing the $Ta_{1-x}Al_xO_yN_z$ dielectric layer in a low temperature plasma to form an oxidized $Ta_{1-x}Al_xO_yN_z$ layer;
annealing the oxidized $Ta_{1-x}Al_xO_yN_z$ dielectric layer to induce crystallization to form a crystallized $Ta_{1-x}Al_xO_yN_z$ layer; and
forming an upper electrode on the crystallized $Ta_{1-x}Al_xO_yN_z$ dielectric layer.

20. A method of fabricating a capacitor in a semiconductor device according to claim 19, wherein the step of forming the lower electrode further comprises forming a layer of doped polysilicon or amorphous silicon.

21. A method of fabricating a capacitor in a semiconductor device according to claim 19, wherein the step of forming the lower electrode further comprises forming a structure selected from a group consisting of simple stacked, cylindrical, and concave structures.

22. A method of fabricating a capacitor in a semiconductor device according to claim 19, wherein the step of forming the lower electrode further comprises a step of forming a HSG (Hemi Spherical Grain) layer on a surface of the lower electrode.

23. A method of fabricating a capacitor in a semiconductor device according to claim 19, wherein the step of forming the lower electrode further comprises depositing at least one material selected from a group consisting of TiN, TaN, W, WN, WSi, Ru, $RuO_2$, Ir, $IrO_2$, and Pt.

24. A method of fabricating a capacitor in a semiconductor device according to claim 19, further comprising treating a surface of the lower electrode, the step of treating comprising nitridating or oxidizing the lower electrode before forming the $Ta_{1-x}Al_xO_yN_z$ dielectric layer.

25. A method of fabricating a capacitor in a semiconductor device according to claim 24, wherein the step of nitridating the lower electrode further comprises exposing the lower electrode to a plasma in a low pressure chemical vapor deposition (LPCVD) chamber under an ambient of $NH_3$ or $N_2/H_2$ gas while maintaining a temperature of the semiconductor substrate at a temperature of 300 to 500° C.

26. A method of fabricating a capacitor in a semiconductor device according to claim 24, wherein the step of nitridating the lower electrode further comprises annealing the lower electrode in a rapid thermal annealing (RTA) process at a temperature of 650 to 950° C. under an ambient of $NH_3$.

27. A method of fabricating a capacitor in a semiconductor device according to claim 24, wherein the step of nitridating the lower electrode further comprises maintaining the semiconductor substrate at a temperature of 500 to 1000° C. under an ambient of $NH_3$.

28. A method of fabricating a capacitor in a semiconductor device according to claim 24, further comprising a step of cleansing the semiconductor substrate using an HF compound such as HF vapor or an HF solution before forming the $Ta_{1-x}Al_xO_yN_z$ dielectric layer.

29. A method of fabricating a capacitor in a semiconductor device according to claim 19, wherein the step of forming the $Ta_{1-x}Al_xO_yN_z$ dielectric layer further comprises supplying an LPCVD chamber with $NH_3$ gas at a temperature of 300 to 600° C. with a flow of 10 to 1000 sccm;

maintaining an evaporator or an evaporation tube at a temperature of 150 to 300° C.;

supplying an organometallic compound solution comprising $Ta(OC_2H_5)_5$ (tantalum ethylate) and $Al(OC_2H_5)_3$ (aluminum ethylate) through a flow controller, to the evaporator or evaporator tube;

forming chemical vapor comprising Ta and Al components by evaporating the organometallic compound solution;

transferring the chemical vapor to the LPCVD chamber through a supply pipe, the temperature of the supply pipe being at least 150° C.; and forming the $Ta_{1-x}Al_xO_yN_z$ dielectric layer at a total pressure of less than 100 Torr in the LPCVD chamber.

30. A method of fabricating a capacitor in a semiconductor device according to claim 19, wherein the step of oxidizing the $Ta_{1-x}Al_xO_yN_z$ dielectric layer further comprises exposing the $Ta_{1-x}Al_xO_yN_z$ dielectric layer to a low temperature plasma in an ambient of $N_2O$ or $O_2$ gas at a temperature of 300 to 600° C.

31. A method of fabricating a capacitor in a semiconductor device according to claim 19, wherein the step of annealing the oxidized $Ta_{1-x}Al_xO_yN_z$ dielectric layer further comprises placing the semiconductor substrate in an electric furnace or a RTP device at a temperature of about 700 to 900° C. under an ambient of $N_2$ or $NH_3$, for a time sufficient to produce substantial crystallization of the $Ta_{1-x}Al_xO_yN_z$ dielectric layer.

32. A method of fabricating a capacitor in a semiconductor device according to claim 19, wherein the step of forming the upper electrode further comprises depositing a layer of at least one conductor selected from a group consisting of TiN, TaN, W, WN, WSi, Ru, $RuO_2$, Ir, $IrO_2$, and Pt.

33. A method of fabricating a capacitor in a semiconductor device according to claim 32, wherein the step of depositing the layer of at least one conductor further comprises the steps of forming a layer having a thickness of 100 to 600 Å thick on the $Ta_{1-x}Al_xO_yN_z$ dielectric layer 19 and then forming a doped polysilicon layer on the conductor.

* * * * *